United States Patent
Fruehling et al.

(10) Patent No.: US 10,831,018 B2
(45) Date of Patent: Nov. 10, 2020

(54) METHODS AND APPARATUS FOR INCREASING EFFICIENCY AND OPTICAL BANDWIDTH OF A MICROELECTROMECHANICAL SYSTEM PISTON-MODE SPATIAL LIGHT MODULATOR

(71) Applicant: Texas Instruments Incorporated, Dallas, TX (US)

(72) Inventors: Adam Joseph Fruehling, Dallas, TX (US); James Norman Hall, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 160 days.

(21) Appl. No.: 15/836,521

(22) Filed: Dec. 8, 2017

(65) Prior Publication Data

US 2019/0179134 A1    Jun. 13, 2019

(51) Int. Cl.
*G02B 26/00* (2006.01)
*G02B 26/06* (2006.01)
*G02B 26/08* (2006.01)
*G09G 3/34* (2006.01)

(52) U.S. Cl.
CPC .......... *G02B 26/06* (2013.01); *G02B 26/0833* (2013.01); *G02B 26/0841* (2013.01); *G09G 3/3466* (2013.01); *B81B 2201/04* (2013.01)

(58) Field of Classification Search
CPC ............ G02B 26/0841; G02B 26/0833; G02B 26/001; G02B 26/06; G02B 27/425; G02B 5/09; G02B 7/1821

USPC ......... 359/237, 265–267, 290–292, 295, 298
See application file for complete search history.

(56) References Cited

U.S. PATENT DOCUMENTS

| | | |
|---|---|---|
| 5,212,582 A | 5/1993 | Nelson |
| 5,606,441 A | 2/1997 | Florence et al. |
| 5,719,695 A | 2/1998 | Heimbuch |
| 6,028,689 A | 2/2000 | Michalicek et al. |
| 6,329,738 B1 | 12/2001 | Hung et al. |

(Continued)

FOREIGN PATENT DOCUMENTS

JP    2013171219 A    9/2013

OTHER PUBLICATIONS

International Search Report for PCT/US2018/064754 dated Apr. 4, 2019.

(Continued)

*Primary Examiner* — Brandi N Thomas
(74) *Attorney, Agent, or Firm* — Michael A. Davis, Jr.; Charles A. Brill; Frank D. Cimino

(57) ABSTRACT

In methods and apparatus for increasing efficiency and optical bandwidth of a microelectromechanical system piston-mode spatial light modulator, an example apparatus includes: an electrode with spring legs; a base electrode; a mirror displacement determiner to determine a periodic signal corresponding to a displacement distance of the electrode beyond an instability point of the electrode; and a voltage source to output a periodic voltage to the base electrode in response to the periodic signal. The periodic voltage causes the spring legs to vary displacement of the electrode with respect to the base electrode according to the periodic voltage. The displacement includes distances beyond the instability point.

18 Claims, 9 Drawing Sheets

(56) References Cited

U.S. PATENT DOCUMENTS

| | | |
|---|---|---|
| 6,867,897 B2 | 3/2005 | Patel et al. |
| 7,477,440 B1 | 1/2009 | Huang |
| 2003/0168928 A1 | 9/2003 | Clark et al. |
| 2004/0248417 A1 | 12/2004 | Malone |
| 2006/0119922 A1 | 6/2006 | Faase et al. |
| 2013/0278912 A1* | 10/2013 | Owa .................... G02B 7/1821 355/71 |
| 2017/0003392 A1 | 1/2017 | Bartlett et al. |
| 2017/0328989 A1 | 11/2017 | Bartlett |
| 2019/0179134 A1 | 6/2019 | Fruehling et al. |

OTHER PUBLICATIONS

International Search Report for PCT/US2018/064757 dated Apr. 11, 2019.

R.W. Gerchberg and W.O. Sexton, "A Practical Algorithm for the Determination of Phase From Image and Diffraction Plane Pictures", Optik, vol. 35, No. 2, (1972), retrieved Oct. 14, 2019 from the uniform resource locator, pp. 1-6, (URL):https://antoine.wojdyla.fr/assets/archive/gerchberg_saxton1972.pdf.

Bifano, Thomas et. al., "Large-scale metal MEMS mirror arrays with integrated electronics", Design, Test, Integration and Packaging of MEMS/MOEMS 2002, Proceedings of the SPIE, vol. 4755, pp. 467-746, 2002; retrieved Oct. 15, 2019 from the uniform resource locator (URL): http://people.bu.edu/tgb/PDF_files/17_DTIPSLM.pdf.

Bartlett, Terry et. al., "Adapting Texas Instruments (TI) DLP technology to demonstrate a phase spatial light modulator", Emerging Digital Micromirror Device Based Systems and Applications XI, Proceedings of the SPIE, vol. 10932 (Mar. 4, 2019), 13 pages.

* cited by examiner

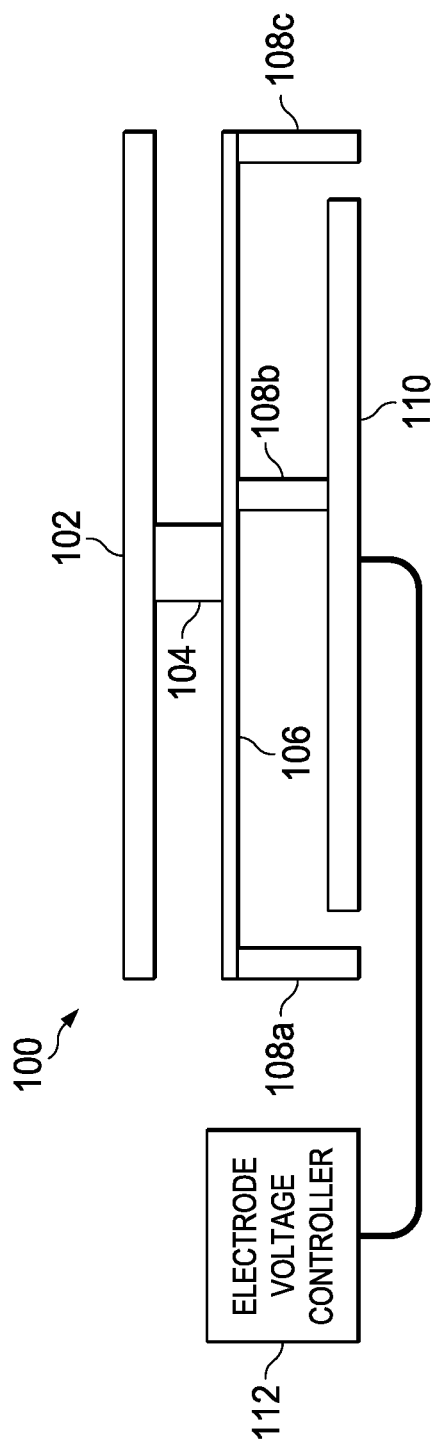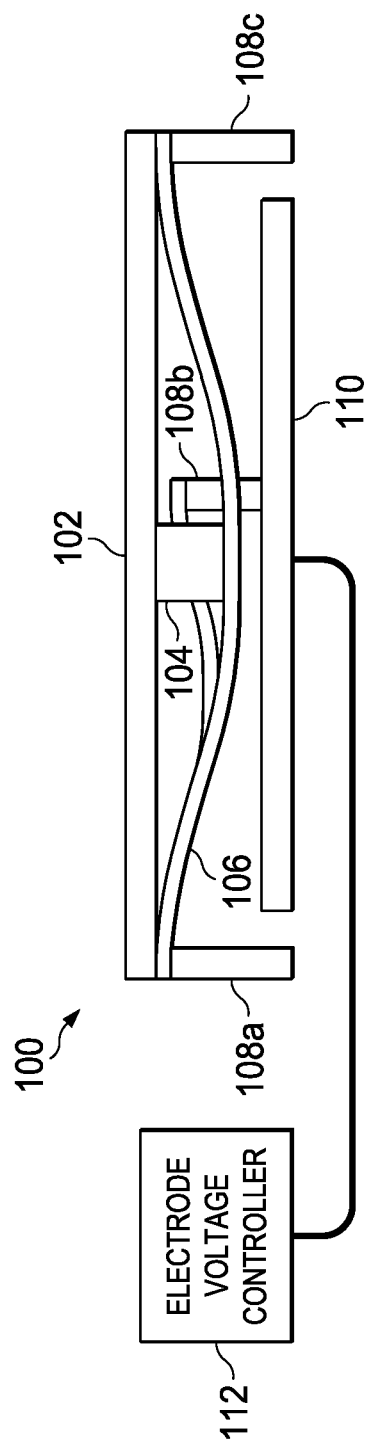

US 10,831,018 B2

METHODS AND APPARATUS FOR INCREASING EFFICIENCY AND OPTICAL BANDWIDTH OF A MICROELECTROMECHANICAL SYSTEM PISTON-MODE SPATIAL LIGHT MODULATOR

CROSS-REFERENCE TO RELATED APPLICATIONS

This application is related to co-owned co-pending U.S. patent application Ser. No. 15/836,536, filed Dec. 8, 2017.

TECHNICAL FIELD

This relates generally to microelectromechanical systems, and more particularly to methods and apparatus for increasing efficiency and optical bandwidth of a microelectromechanical system piston-mode spatial light modulator.

BACKGROUND

Spatial light modulators (SLMs) spatially vary modulation of a beam of light. The SLMs operate pixels, each including a respective mirror that moves to vary an intensity and/or phase of the beam of light. In some examples, microelectromechanical system (MEMS) SLMs vary positions of (e.g., move) the mirrors to change the intensity and/or phase of the beam of light. Such MEMS include a base electrode and a spring electrode coupled to the mirror. When a voltage differential is created between the base electrode (coupled to a base of a pixel) and the spring electrode, the spring electrode moves toward the base electrode, thereby moving the mirror to a different position. MEMS SLMs are used in a variety of ways, such as in projectors, high dynamic range cinema, light detection and ranging systems, high volume optical switching (e.g., in telecom or server farms), microscopy/spectroscopy/adaptive optics (e.g., in astronomy, ophthalmology, machine vision), and holographic displays.

SUMMARY

In described examples of apparatus to increase efficiency and optical bandwidth of a microelectromechanical system piston-mode spatial light modulator, the apparatus includes an electrode with spring legs. The apparatus further includes a base electrode. The apparatus further includes a mirror displacement determiner to determine a periodic signal corresponding to a displacement distance of the electrode beyond an instability point of the electrode. The apparatus further includes a voltage source to output a periodic voltage to the base electrode in response to the periodic signal, the periodic voltage to cause the spring legs to vary displacement of the electrode with respect to the base electrode according to the periodic voltage, the displacement including distances beyond the instability point.

In described examples of a method to increase efficiency and optical bandwidth of a microelectromechanical system piston-mode spatial light modulator, the method includes determining a periodic signal corresponding to a displacement distance of an electrode of a pixel beyond an instability point of the electrode. The method further includes outputting a periodic voltage to a base electrode in response to the periodic signal, the periodic voltage causing spring legs of the electrode to vary displacement of the electrode with respect to the base electrode according to the periodic voltage, the displacement including distances beyond the instability point.

In described examples of apparatus to increase efficiency and optical bandwidth of a microelectromechanical system piston-mode spatial light modulator, the apparatus includes a mirror. The apparatus further includes an electrode attached to the mirror. The electrode includes a rigid body and three spring legs coupled to the rigid body to displace the rigid body in response to an electrostatic force applied to the electrode

BRIEF DESCRIPTION OF THE DRAWINGS

FIGS. 1A and 1B are side views of an example MEMS SLM pixel in two different positions.

DETAILED DESCRIPTION

Figure 2:
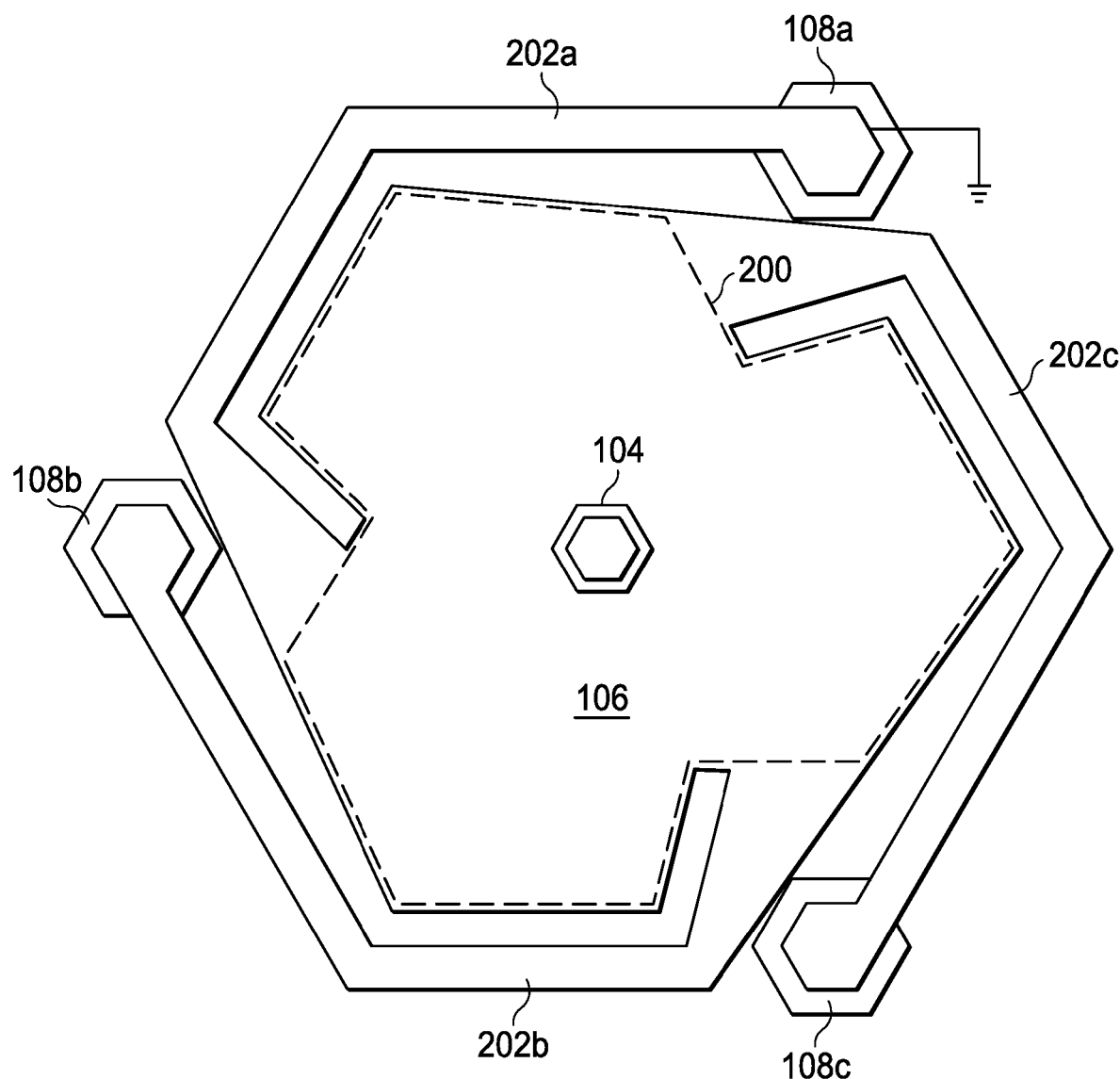
FIG. 2 is a plan view of an example spring structure of the pixel of FIGS. 1A and 1B.

The drawings are not necessarily drawn to scale. In the drawings, like parts are referenced by like reference numbers.

SLMs spatially vary modulation of a beam of light, by reflecting it to control properties (e.g., intensity and/or phase) of the reflected beam. To modulate the beam of light, SLM pixels include adjustable (movable, displaceable) mirrors to change the reflected beam's properties. In some examples, SLMs include MEMS to move the mirrors in response to a combination of an electrostatic force and a spring force.

FIGS. 1A and 1B are side views of two positions of an example pixel 100 of a MEMS SLM. FIGS. 1A and 1B show an example mirror 102, an example mirror attachment 104 (e.g., a mirror via), an example spring 106 (e.g., herein referred to as "spring," "spring structure" or "spring electrode") (e.g., a first electrode), example spring attachments 108a-c (e.g., a spring via), an example base electrode 110 (e.g., a second electrode), and an example electrode voltage controller 112.

The mirror 102 reflects a beam of light in one or more directions, according to a position of the mirror. For example, the mirror 102 is extended in a first position in FIG. 1A to reflect light, and the mirror 102 is retracted to a second position in FIG. 1B to reflect light. The mirror 102 reflects light corresponding to a pure phase contrast device with a continuous phase range. In this manner, an array of mirrors may be displaced in different positions to create different interference patterns (e.g., corresponding to different intensities).

The spring 106 is an electrode including spring legs and a rigid body. The spring structure 106 is coupled to the mirror 102 via the mirror attachment 104, thereby providing additional rigidity to the rigid body. The spring legs of the spring structure 106 correspond to a mechanical spring constant that, when stretched, applies a mechanical force in the opposite direction of the stretching. The spring legs are attached to the spring attachments 108a-c, which may be grounded. In this manner, when an electrostatic force is applied to the spring structure 106 in a downward motion, the spring legs extend toward the base electrode 110, causing the rigid body of the spring structure 106 to lower, thereby causing the mirror 102 to move from the position of FIG. 1A toward the position of FIG. 1B. Although the spring structure 106 may be any shape, a hexagon-shaped spring structure increases an area-to-perimeter ratio of the rigid body, so the voltage applied to the base electrode 110 may be significantly lower than conventional pixels without reducing the pixel's quality (e.g., corresponding to a total distance of the mirror displacement).

In some examples, a length of the spring attachments 108a-c is longer than a length of the mirror attachment 104. In this manner, even if the mirror 102 is fully displaced by the electrostatic force, the spring structure 106 will not directly contact the base electrode 110 (e.g., will not cause an electrical short). In some examples, the mirror 102, the mirror attachment 104, the spring structure 106, and/or the spring attachments 108a-c are covered by a similar material. In this manner, a zero-voltage potential exists between the mirror 102, the mirror attachment 104, the spring structure 106, and/or the spring attachments 108a-c.

In operation, the base electrode 110 receives a voltage from the electrode voltage controller 112. The voltage on the base electrode 110 generates an electrostatic force that, when stronger than the spring constant of the spring structure 106, causes the spring structure 106 to move toward the base electrode 110. A displacement of the spring structure 106 increases as more voltage is applied on the base electrode 110, and/or as more area of the voltage is applied by the base electrode 110. In some examples, the base electrode 110 is an analog-type electrode, in which the voltage is equally spread throughout the base electrode 110. Accordingly, the electrode voltage controller 112 outputs an analog voltage in order to move the spring structure 106 and the mirror 102 to different positions (e.g., each voltage level corresponding to a different position). In some examples, the base electrode 110 is a digital-type electrode, in which the voltage is applied to different areas (e.g., bits) of the base electrode 110. For example, the base electrode 110 may include three bits (bit_0, bit_1, and bit_2), for linear bit spacing, so the areas increase binarily (e.g. bit 0 is ½ the area of bit 1, and bit 1 is ½ the area of bit 2. However, this area ratio may be varied to compensate for nonlinearity of the electrostatic force, curved/sloped electrodes, and/or nonlinear springs, as further described hereinbelow. Although the example of FIGS. 1A and 1B corresponds to a 3-bit electrode configuration, the base electrode 110 may include any number of bits, subject to lithography and routing limitations. Accordingly: (a) if 5 V is applied to bit_0, then the spring structure 106 is moved to a first position; (b) if 5 V is applied to bit_0 and bit_1, then the spring structure 106 is moved to a second position (lower than the first position); and (c) if 5 V is applied to bit_0, bit_1 and bit_2, then the spring structure 106 is moved to a third position (lower than the second position).

The electrode voltage controller 112 controls the displacement of the mirror 102 by transmitting a voltage to the base electrode 110 to generate an electrostatic force between the base electrode 110 and the spring structure 106, thereby causing the spring structure 106 (and thus the mirror 102) to move toward the base electrode 110. The electrode voltage controller 112 applies the voltage to correspond to a distance, according to a desired output (e.g., received from another computing device or circuit). In some examples, the electrode voltage controller 112 generates a periodic signal (e.g., a digital pulsing signal or a sinusoid) that causes the spring structure 106 (e.g., and thus the mirror 102) to be pulled toward and away from the base electrode 110 in a periodic fashion. As described herein, periodically varying the voltage to periodically vary the displacement of the spring structure 106 allows the electrode voltage controller 112 to move the spring structure 106 beyond a d/3 threshold distance (e.g., an instability point) toward the base electrode 110 without collapsing (e.g., without causing the spring structure 106 to collapse toward the base electrode 110). The electrode voltage controller 112, using the periodic varying technique, is able to move the spring structure 106 to about 9/10 the distance to the base electrode 110. Because the electrode voltage controller 112 is varying the displacement of the spring structure 106 with time, a receiving device (e.g., receiving light reflected by the mirror 102) needs to obtain the information regarding the periodic variation to sample the received signal (e.g., the light reflected of the mirror 102) according to a desired displacement. For example, if the electrode voltage controller 112 is varying the voltage applied by the base electrode 110 to move the spring structure 106 at a particular rate with a particular total distance (e.g., amplitude of the periodic displacement), the receiving device can sample the received signal for a desired displacement according to the known rate and distance. Although example electrode voltage controller 112 controls the pixel 100, the electrode voltage controller 112 may control multiple pixels. For example, the electrode voltage controller 112 may be coupled to base electrodes that each operate independently, as a group, or as subgroups (e.g., a first subgroup controlled with a first voltage and a second subgroup controlled by a second voltage). The electrode voltage controller 112 is further described hereinbelow in conjunction with FIG. 5.

FIG. 2 illustrates an example overhead view of the spring structure 106 above the base electrode 110 of the pixel 100 of FIGS. 1A and 1B. The overhead view of FIG. 2 includes the mirror attachment 104, the spring structure 106, the spring attachments 108a-c, and the base electrode 110 of FIGS. 1A and 1B. The spring structure 106 of FIG. 2 includes an example body 200 and example spring legs 202a-c.

As described herein, the spring structure 106 of FIG. 2 is a three-legged hexagon-shaped spring structure that increases the area-to-perimeter ratio of the rigid body thereby allowing the voltage applied to the base electrode 110 to be significantly lower than conventional pixels without reducing the quality (e.g., corresponding to the total distance that the mirror displacement) of the pixel. Alternatively, the spring structure 106 may be a different shape with a different area-to-perimeter ratio corresponding to a different voltage that may need to be applied by the base electrode 110.

The body 200 of FIG. 2 is a rigid structure that maintains its structure when the base electrode 110 increases voltage. When the base electrode 110 increases voltage, the body 200 moves toward the base electrode 110 while maintaining its form. In this manner, the surface area exposed to the base electrode voltage is increased to increase the overall efficiency of the structure. The mirror attachment 104 attaches to the body 200, thereby causing the mirror 102 of FIG. 2 to move with the movement of the body 200. Also, the mirror attachment 104 provides additional rigidity to the body 200. Although the mirror attachment 104 is attached to the spring structure 106 in the middle, the mirror attachment 104 may be attached anywhere along the body 200 and/or may include multiple mirror attachments at various locations on the body 200. These multiple attachment points can be used to increase the stiffness of the main lower electrode body while weakening the spring legs, or vice versa. The body 200 is attached to the spring legs 202a-c.

The spring legs 202a-c of FIG. 2 are attached to the spring attachments 108a-c and the spring body 200. In the illustrated example, the spring attachment 108a-c is grounded; thus, the spring legs 202a-c and the spring body 200 are also grounded. The spring legs 202a-c include a spring constant corresponding to a spring force to maintain the body 200 at a first position. As the electrostatic force of the base electrode 110 increases (e.g., according to a voltage differential between the grounded spring structure 106 and the biased base electrode 110 of FIGS. 1A and 1B), the spring legs 202a-c are stretched toward the base electrode 110, thereby lowering the body 200. The spring constant may be based on the material of the spring structure 106 and/or based on the dimensions of the spring legs 202a-c. For example, the spring legs 202a-c are long and wrapped around the hexagon structure before blending into the body 200. Such a structure provides give that corresponds to a spring constant, while preserving the area-to-perimeter ratio of the body 200. In the illustrated example, the spring structure 106 is one unified piece of unified material (e.g., the body 200 and the spring legs 202a-c are made of a same material and are integral within a same structure). However, the body 200 and the spring legs 202a-c may be different materials attached together (e.g., a first material to correspond to the spring constant of the spring legs 202a-c and a second material to correspond to the rigidity of the body 200). The three-legged hexagon structure of FIG. 2 decreases the stiffness (e.g., the spring constant) of the spring legs 202a-c, while providing sufficient support for the body 200.

Figure 3A:
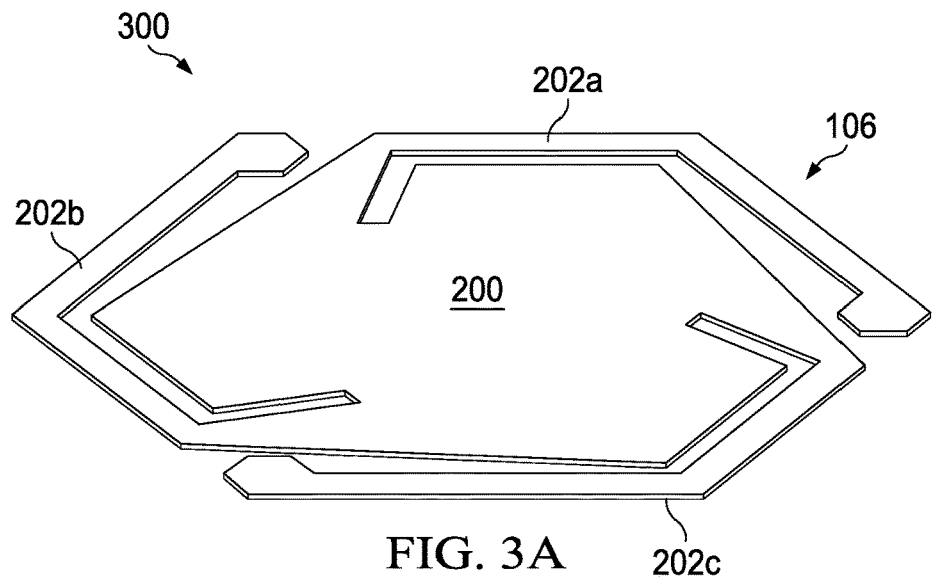
FIGS. 3A-3C are perspective views of three example displacements of the spring structure of FIGS. 1A, 1B and 2.
Figure 3B:
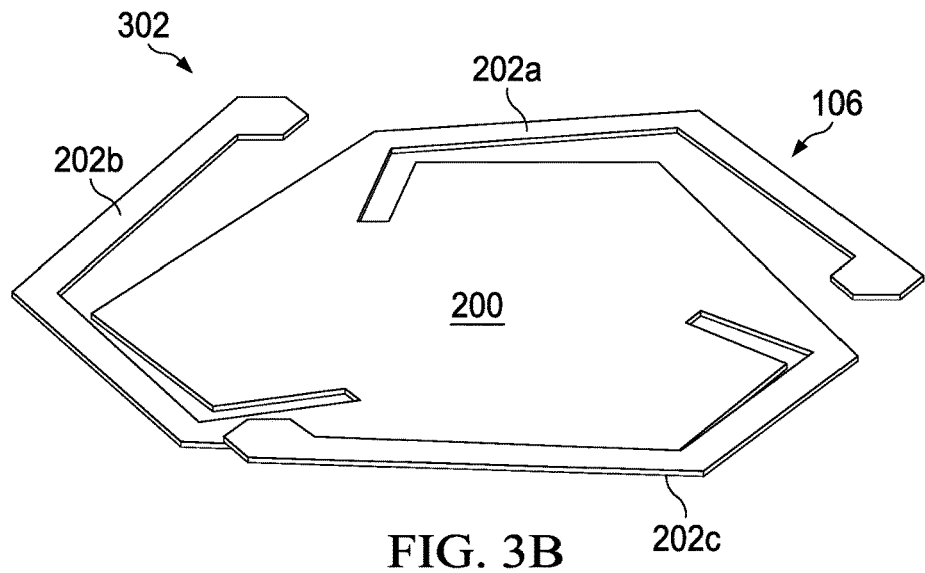
Figure 3C:
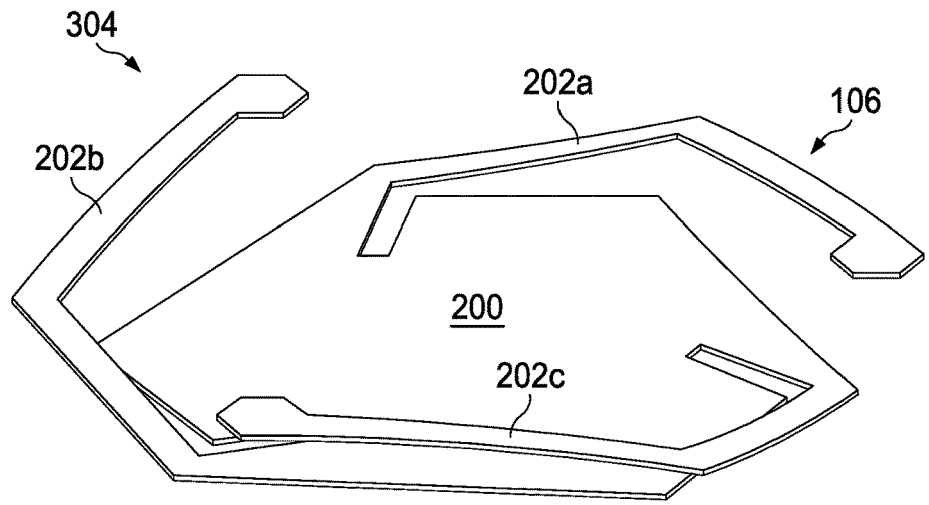

FIGS. 3A-3C illustrate three example displacements of the spring structure of FIGS. 1A, 1B and 2. FIGS. 3A-3C include the body 200 and the spring legs 202a-c of the spring structure 106 of FIG. 2. FIG. 3A illustrates an example first spring displacement 300 corresponding to a first voltage being applied to the base electrode 110 of FIGS. 1A and 1B. FIG. 3B illustrates an example second spring displacement 302 corresponding to a second voltage being applied to the base electrode 110 of FIGS. 1A and 1B. FIG. 3C illustrates an example third spring displacement 304 corresponding to a third voltage being applied to the base electrode 110 of FIGS. 1A and 1B.

In FIG. 3A, the electrode voltage controller 112 is not applying a voltage to the base electrode 110. Because no voltage differential exists between the spring structure 106 and the base electrode 110, no electrostatic force exists to pull the body 200 toward the base electrode 110. Accordingly, FIG. 3A illustrates the spring structure 106 with no displacement. For example, the spring legs 202a-c are at the same level as the spring body 200, and no downward force is being applied.

In FIG. 3B, the electrode voltage controller 112 is applying a first voltage to the base electrode 110 (e.g., a first analog voltage throughout the base electrode 110 or a voltage corresponding to a first area of the total area of the base electrode 110). The first voltage applied to the base electrode 110 causes a first voltage differential between the base electrode 110 and the spring structure 106, thereby causing an electrostatic force to drive the body 200 downward towards the base electrode 110. The first voltage corresponds to a first electrostatic force that causes the spring legs 202a-c to stretch and lower the body 200 to a first position (e.g., corresponding to a 10 millimeter (mm) displacement) from the position of FIG. 3A).

In FIG. 3C, the electrode voltage controller 112 is applying a second voltage to the base electrode 110 (e.g., a second analog voltage higher than the first analog voltage of FIG. 3B or the voltage of FIG. 3B corresponding to a second area larger than the first area of the base electrode 110). The second voltage (e.g., higher or over a wider area) applied to the base electrode 110 causes a second, higher voltage differential between the base electrode 110 and the spring structure 106, thereby causing an electrostatic force to drive the body 200 further downward towards the base electrode 110. The second voltage corresponds to a second electrostatic force that causes the spring legs 202a-c to stretch further and lower the body 200 to a second position (e.g., corresponding to a 30 millimeter (mm) displacement) from the position of FIG. 3A).

As illustrated in FIGS. 3A-3C, the stronger the voltage applied to the base electrode 110 (e.g., higher voltage or over a larger area), the further the body 200 displaces towards the base electrode 110. As described herein, in each position of the body 200, the body 200 remains rigid, while the spring legs 202a-c stretch in response to the electrostatic force.

Figure 4A:
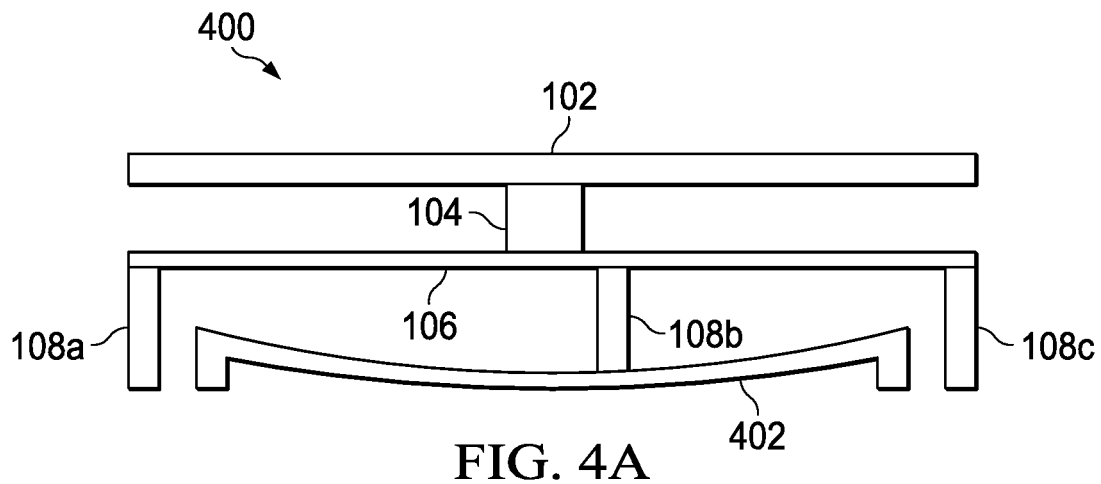
FIGS. 4A-4C are side views of three example alternative pixel structures of a MEMS SLM.
Figure 4B:
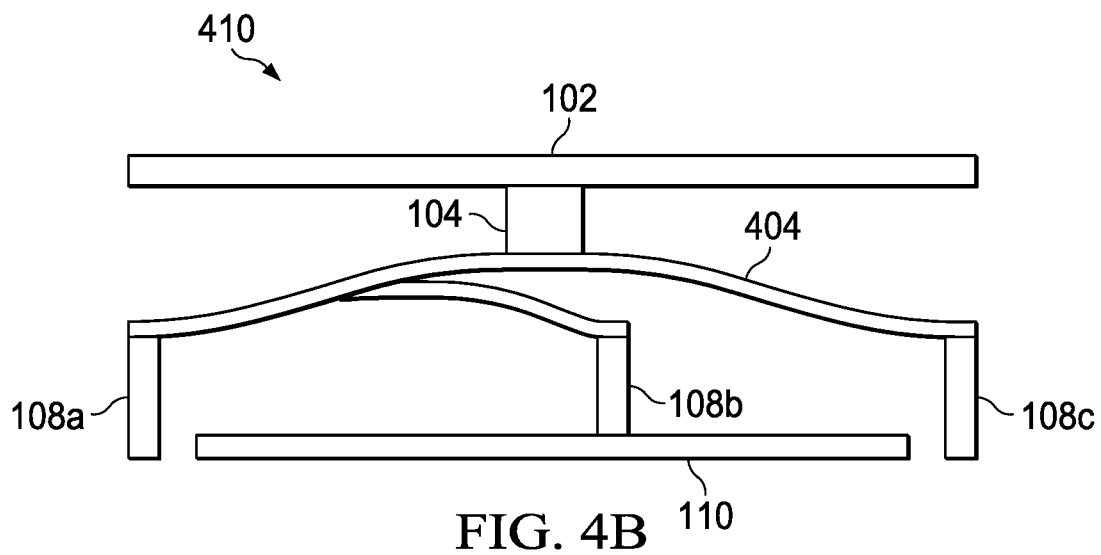
Figure 4C:
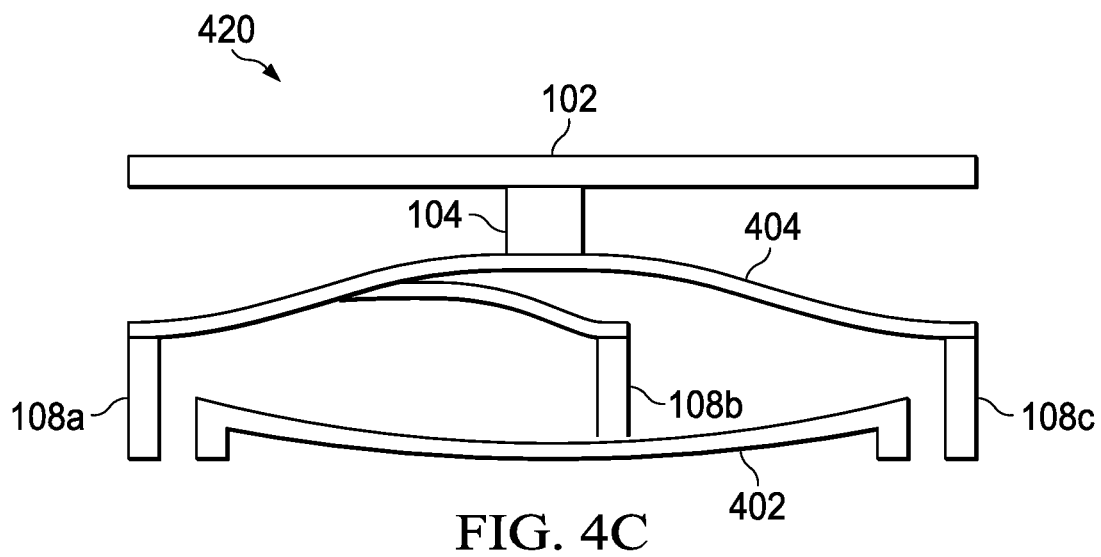

FIGS. 4A-4C illustrate three example alternative pixel structures of a MEMS SLM. The examples of FIGS. 4A-4C include the mirror 102, the mirror attachment 104, the spring structure 106, the spring attachment 108a-c, and the base electrode 110 of FIGS. 1A and 1B. The examples of FIGS. 4A-4C further include an example non-uniform base electrode 402 and an example non-uniform spring structure 404 in a first example pixel structure 400, a second example pixel structure 410, and/or a third example pixel structure 420.

The first example pixel structure 400 of FIG. 4A includes the non-uniform base electrode 402. The non-uniform base electrode 402 has a structure that is gray scale slopped rather than flat. The non-uniform base electrode 402 may be curved, bowled, slanted, sloped, and/or any other structure other than a flat structure. For example, the non-uniform base electrode 402 may be curved away from each other (e.g., to progressively increase the distance d over position). For example, in such curved structures, the distance d between the base electrode 402 and the spring electrode 106 increases as the position along the actuating structure increase from the support structure. Adjusting (e.g., curving) the base electrode 402 changes the electrostatic force from uniform, linear forces to non-uniform, non-linear forces. In this manner, when the spring structure 106 approaches the non-uniform base electrode 402, more force will exist near the spring attachment 108a-c, and more restoring force will exist from the spring structure 106 (e.g., the larger the displacement, the larger the resistance of the spring structure 106). By progressively moving the non-uniform base electrode 402 away from the weakest part of the spring structure 106, overall pixel travel is increased, such as from the d/3 threshold of instability to a 2d/3 threshold of instability (e.g. twice the travel of conventional MEMS pixel travel), without collapsing (e.g., without any risk of collapse).

The first example pixel structure 410 of FIG. 4B includes the non-uniform spring structure 404. The non-uniform spring structure 404 has a structure that is gray scale sloped rather than flat. The non-uniform spring structure 404 may be curved, bowled, slanted, sloped, and/or any other structure other than a flat structure. For example, the non-uniform spring structure 404 may be curved away from each other (e.g., to progressively increase the distance d over position). For example, in such curved structures, the distance d between the base electrode 110 and the spring electrode 404 increases as the position along the actuating structure increase from the support structure. Adjusting (e.g., curving) the spring structure 404 changes the electrostatic force from uniform, linear forces to non-uniform, non-linear forces. In this manner, when the spring structure 404 approaches the base electrode 110, more force will exist near the spring attachment 108*a-c*, and more restoring force will exist from the spring structure 404 (e.g., the larger the displacement, the larger the resistance of the spring structure 404). By progressively moving the weakest part of the non-uniform spring structure 404 away from the base electrode 110, overall pixel travel is increased, such as from the d/3 threshold of instability to a 2d/3 threshold of instability (e.g. twice the travel of conventional MEMS pixel travel), without collapsing. The third example pixel structure 420 of FIG. 4C includes the non-uniform base electrode 402 and the non-uniform spring structure 404 of FIGS. 4A and 4B. Like the pixel structures 400 and 410, the pixel structure 420 corresponds to overall pixel travel increase, such as from the d/3 threshold of instability to a 2d/3 threshold of instability (e.g. twice the travel of conventional MEMS pixel travel), without collapsing.

Accordingly, MEMS may apply electrostatic force to move the mirror 102 of an SLM pixel 100, 400, 410, 420. For example, the MEMS pixel 100, 400, 410, 420 includes the first electrode 106, 404 coupled to the mirror 102. The first electrode 106, 404 is also anchored to the attachment 104, which is a distance d away from a second electrode 110, 402 (e.g., above the second electrode 110, 402 in a vertical construction). The first electrode 106, 404 includes one or more springs to maintain a position of the first electrode 106, 404 (e.g., the distance d away from the second electrode 110, 402), but allowing the first electrode 106, 404 to move in and out (e.g., up and down in a vertical construction) if a second force overcomes the spring force. The first electrode 106, 404 is grounded, and the second electrode 110, 402 is coupled to a voltage regulator 504. The voltage regulator 504 applies a bias voltage to the second electrode 110, 402. When the bias voltage applied to the second electrode 110, 402 increases, the voltage differential between the first electrode 106, 404 and the second electrode 110, 402 generates an electrostatic force that drives the first electrode 106, 404 toward the second electrode 110, 402, thereby moving the mirror 102 toward the second electrode 110, 402. Additionally or alternatively, the amount of area of the second (e.g., base) electrode 110, 402 that applies the bias voltage may increase, thereby increasing the electrostatic force and pulling the first electrode 106, 404 closer to the second electrode 110, 402, such as in digital style electrodes. The electrostatic force decreases as the voltage decreases (and/or as the amount of area applying the voltage on the second electrode 110, 402 decreases), thereby allowing the springs' restoring forces to move the first electrode 106, 404 away from the second electrode 110, 402. In this manner, a controller 112 can control the voltage and/or amount of area applying a voltage on the second electrode 110, 402 to control the position of the first electrode 106, 404, thereby controlling the position of the mirror 102. The amount of travel of the mirror 102 corresponds to an achievable phase modulation of a device. Accordingly, examples described herein increase the travel distance of the mirror 102 in the MEMS pixel 100, 400, 410, 420 without shortcomings of conventional MEMS pixels.

MEMS pixels include a pull-in point, also referred to herein as an instability point, corresponding to a maximum distance that the first electrode 106, 404 can travel before a collapse occurs (e.g., before the first electrode 106, 404 collapses toward the second electrode 110, 402, thereby destroying the pixel's functionality). The instability point is an equilibrium point, beyond which the system is potentially unstable. The stability of the system depends on the differential of the net force $$\left(\text{e.g., } \frac{dF}{dx}\bigg|_{x=x_e} < 0 \text{ stable equilibrium, and } \frac{dF}{dx}\bigg|_{x=x_e} > \right.$$

0 unstable equilibrium, where $x_e$ is the equilibrium displacement). The net force is represented a combination of the electrostatic force and the spring force $$\left(\text{e.g., } F = F_{electrostatic} + F_{mechanical} = \frac{\in A}{2(d-x)^2} V^2 - kx,\right.$$

where E is the permittivity of the dielectric between the two electrodes, A is the Area of the base electrode, x is the displacement of the spring electrode 106, 404, and –kx is the restoring force in a linear spring). Accordingly, in that example, the first electrode 106, 404 cannot maintain a position more than a d/3 threshold distance to the second electrode 110, 402. For example, if the spring electrode 106, 404 is (without any electrostatic force applied) 900 micrometers from the base electrode, the spring electrode 106, 404 may only travel 300 micrometers toward the base electrode before pull-in occurs. But examples described herein include techniques to operate the pixel 100, 400, 410, 420 beyond the instability point without causing collapsing.

Conventional MEMS pixels include four attachments to anchor the first electrode (e.g., the spring electrode) to a surface. The first electrode of some conventional MEMS pixels includes four legs (having a spring constant) that attach to a rigid body. In this manner, when the electrostatic force increases, the legs stretch to allow the rigid body to move toward a base electrode. However, such a design increases the vertical stiffness of the springs, thereby requiring either: (a) increasing the voltage applied to the base electrode (e.g., wasting energy); or (b) increasing the size of the base and/or spring electrode (e.g., increasing the footprint and decreasing a packing factor). For example, conventional MEMS pixels require a bias voltage (e.g., the voltage applied by the second electrode) between 20 and 200 V to provide sufficient electrostatic force to move a conventional spring electrode 106, 404/mirror 102 to a desired position. Also, increasing the size of the electrodes limits the beam steering angle, limits the optical bandwidth, and limits the mechanical bandwidth. Examples described herein alleviate the power and size of such conventional MEMS pixels, by implementing the pixel 100, 400, 410, 420 using only three attachments 108a-c to anchor the spring electrode 106, 404, thereby reducing the vertical stiffness by 25%. In this manner, the pixel size and bias voltage to control the position of the mirror 102 can be reduced. Also, some examples described herein include a spring electrode design (e.g., a hexagon-based design) that increases the perimeter-area ratio to further increase the efficiency of the MEMS pixel 100, 400, 410, 420. In examples described herein, a MEMS pixel sized below 10 micrometers can operate at a bias voltage of 10 V or less.

Some conventional pixels further reduce the number of anchors to only two support points. However, such conventional pixels make the MEMS design subject to tilt or rotation, due to process nonuniformities and/or deformation caused by thermal stresses or thin film deposition stresses. In examples described herein, these stresses are sufficiently compensated by described anchor design(s). Accordingly, examples described herein include very low tilt/displacement/rotation across process nonuniformities and environmental variation.

Also, some examples described herein include techniques to operate (e.g., move) the spring electrode 106, 404 and the mirror 102 beyond the instability point without collapsing. In some examples described herein, the voltage applied to the base electrode is periodic (e.g., using a digital pulse or a sinusoid), corresponding to a distance beyond the instability point's d/3 threshold distance. Because the voltage corresponds to a distance beyond the d/3 threshold distance for a short duration of time, the first electrode 106, 404 can travel up to a 9d/10 distance to the second electrode 110, 402 without collapsing, thereby achieving a pixel travel that is nearly three times as far as conventional MEMS techniques relying on parallel plate electrostatic actuation. Because a sinusoid or pulse will cause the spring electrode 106, 404 and the mirror 102 to vary distance in a pulse or sinusoid pattern, examples described herein include transmitting data related to the pulse or sinusoid (e.g., phase, amplitude) to a sampler of a receiving device, so that the sampler can sample the light beam corresponding to the desired distance of the mirror. For example, if the pixel 100, 400, 410, 420 is periodic, such that the mirror 102 corresponds to a distance of 600 micrometers every 5 nanoseconds, the sampler can sample the light beam every 5 nanoseconds, so that the sampled light beam corresponds to the 600-micrometer distance of the mirror.

Also, some examples described herein include a mechanical design of the base 110, 402 and/or spring electrode 106, 404 to increase the d/3 threshold to a larger threshold (e.g., a 2d/3 threshold), without needing to sample the output by adjusting properties of the base and/or spring electrode 106, 404. For example, the base electrode 402 and the spring electrode 404 are curved away from each other (e.g., to progressively increase the distance d over position). For example, in such curved structures, the distance between the base 402 and the spring electrode 404 increases as the position along the actuating structure increases from the support structure. Adjusting (e.g., curving) the spring and/or base electrode changes the electrostatic and/or spring force from uniform, linear forces to non-uniform, non-linear forces. In this manner, when the spring electrode 106, 404 approaches the curved base electrode, more force exists nearer to the anchor, and more restoring force exists at the spring (e.g., if the displacement is larger, then the spring's resistance is larger). The electrostatic force is inversely proportional to the square of the decrease in gap, when the restoring force of the spring is linear, as shown in Equation 1:

$$F_{es} = \frac{\in A}{2(d-x)^2} V^2 \qquad \text{(Equation 1)}$$

Such linearity can be compensated by progressively moving the biasing electrodes away from the weakest part of the spring, so the overall pixel travel increases from the d/3 threshold of instability to a larger (e.g., 2d/3) threshold of instability (e.g. twice the travel of conventional MEMS pixel travel) or greater. Also, this nonlinear attractive force can be balanced to increase the travel before reaching the instability, by pre-curving the spring (e.g., either through process induced stresses in the thin films, lithographic techniques, or other fabrication processes that create curved or sloped structures) to exhibit a nonlinear increase in mechanical stiffness (k) with increased displacement.

Figure 5:
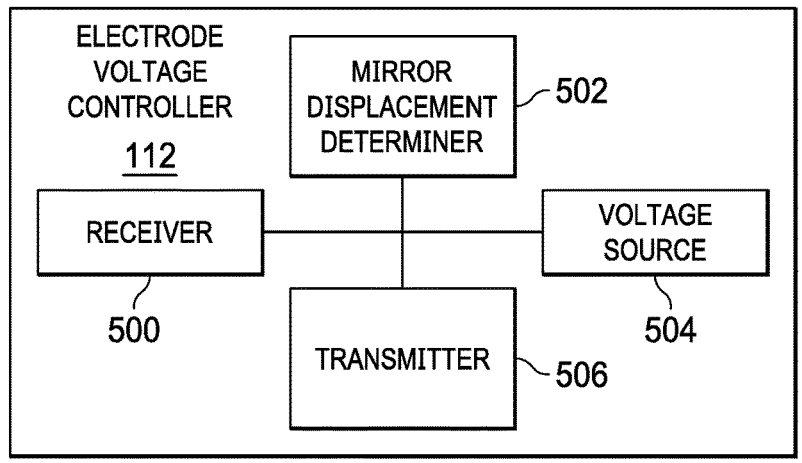
FIG. 5 is a block diagram of an example electrode voltage controller of FIGS. 1A and 1B.

FIG. 5 is a block diagram of the electrode voltage controller 112 of FIGS. 1A and 1B described herein, to periodically vary the voltage applied to the base electrode 110 to periodically displace the spring structure 106 (e.g., and the mirror 102) beyond the instability point corresponding to conventional MEMS pixels. While the electrode voltage controller 112 is described in conjunction with the pixel 100, the electrode voltage controller 112 is useful to control a base electrode of any type of pixel. The electrode voltage controller 112 includes an example receiver 500, an example mirror displacement determiner 502, an example voltage source 504, and an example transmitter 506.

The receiver 500 of FIG. 5 receives instructions to move the mirror 102 of the pixel 100 to some distance from a computing device or circuit. Also, the receiver 500 determines when new instructions are received in order to trigger additional movement of the mirror 102.

The mirror displacement determiner 502 of FIG. 5 processes the received instructions to identify the desired displacement distance of the mirror 102/spring structure 106. The mirror displacement determiner 502 determines whether the desired displacement distance of the received instructions is more or less than the instability point (e.g., the d/3 threshold distance corresponding to the instability point of conventional MEMS pixels). If the desired displacement distance is less than the instability point, the mirror displacement determiner 502 determines which voltage to apply to the base electrode 110 (e.g., for an analog based electrode) and/or how much amount of area of the base electrode 110 to apply a voltage to (e.g., for a digital based electrode). If the desired displacement distance is more than the instability point, the mirror displacement determiner 502 determines a periodic (e.g., a digital pulsing signal or a sinusoid) signal to apply to the base electrode 110. In some examples, the mirror displacement determiner 502 determines, in response to the determined periodic signal, when the signal needs to be sampled to correspond to the desired displacement distance.

The voltage source 504 of FIG. 5 generates a voltage in response to the voltage determined by the mirror displacement determiner 502. The voltage source 504 may capable of outputting a stable voltage and/or a periodic voltage. In some examples, the voltage source 504 may include two or more voltage sources (e.g., one for the stable voltage, and one for the periodic voltage). In some examples, the voltage source 504 is able to generate different periodic signals (such as corresponding to different frequencies, amplitudes, phases, etc.).

The transmitter 506 of FIG. 5 transmits data related to the periodic voltage (e.g., voltage varying data) and/or sampling data to a receiving device via a wired or wireless signal. The voltage varying data includes the phase, frequency, amplitude, etc. related to the voltage applied by the voltage source 504 and/or the phase, frequency, amplitude, etc. related to the movement of the mirror 102 (e.g., if they are not the same). In this manner, the receiving device can determine when to sample the receive signal so that the samples correspond to the desired mirror displacement position. The sampling data may include when to sample the received signal. In this manner, the receiving device can sample in response to the voltage varying data directly (e.g., without calculating when to sample the received light signal).

FIG. 5 shows an example implementation of the electrode voltage controller 112 of FIGS. 1A and 1B. Further, the receiver 500, the mirror displacement determiner 502, the voltage regulator 504, the transmitter 506, and/or more generally the electrode voltage controller 112 of FIG. 5 may be implemented by hardware, software, firmware and/or any combination of hardware, software and/or firmware. For example, any of the receiver 500, the mirror displacement determiner 502, the voltage regulator 504, the transmitter 506, and/or more generally the electrode voltage controller 112 of FIG. 5 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). In an example software and/or firmware implementation, at least one of the receiver 500, the mirror displacement determiner 502, the voltage regulator 504, the transmitter 506, and/or more generally the electrode voltage controller 112 of FIG. 5 include(s) a computer-readable medium (such as a hard drive, a memory, a digital versatile disc (DVD), a compact disc (CD), a Blu-ray disc, or other information storage device) that stores the software and/or firmware.

Figure 6:
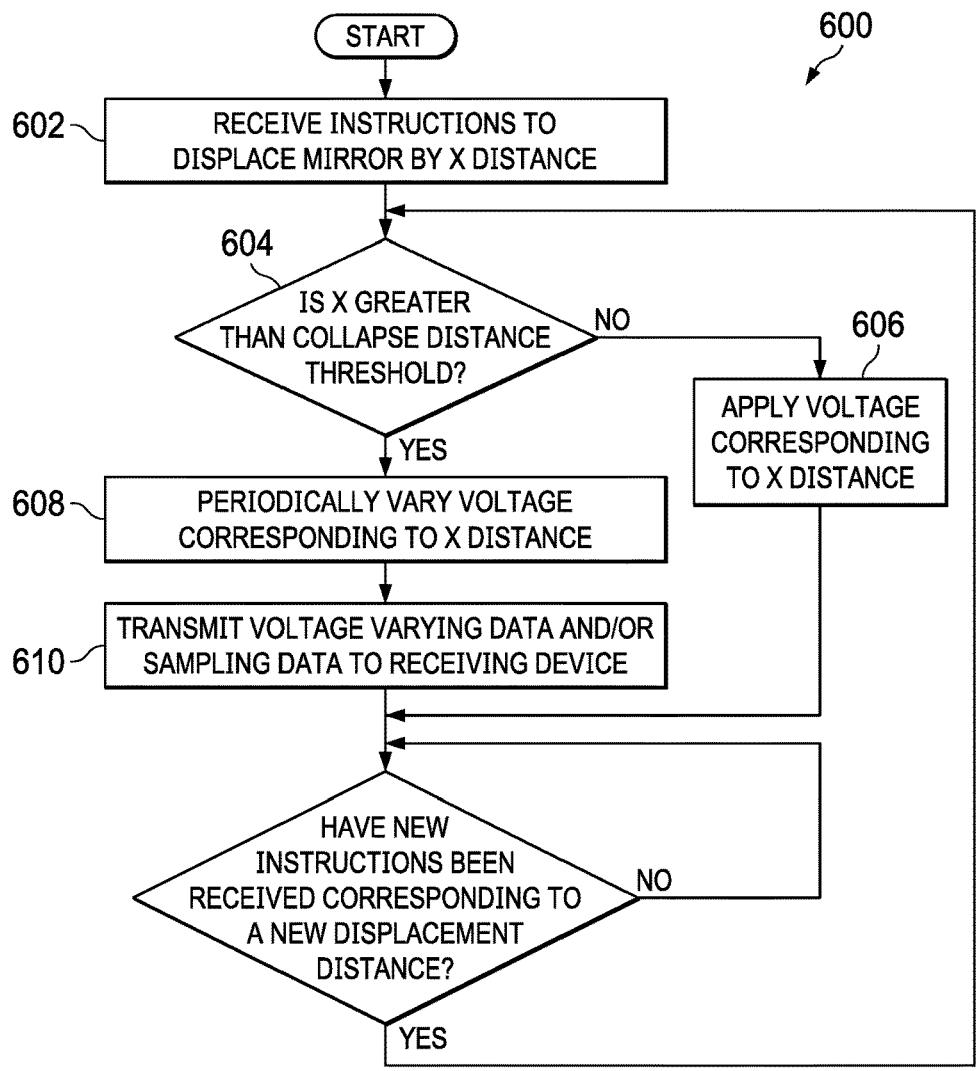
FIG. 6 is a flowchart representative of example machine readable instructions that are executable to implement the electrode voltage controller of FIGS. 1A and 1B to move the position of the spring structures of FIGS. 1A through 4C.

A flowchart representative of example machine readable instructions for implementing the electrode voltage controller 112 of FIG. 5 is shown in FIG. 6. In this example, the machine readable instructions form a program that is processable by an instruction execution apparatus (such as processor 1112 shown in the processor platform 1100 described hereinbelow in connection with FIG. 11) for causing the apparatus to perform the methods and processes described herein. The program may be embodied in software stored on a computer-readable medium, but the entire program and/or parts thereof could alternatively be executed by a device other than the processor 1112 and/or embedded in firmware or dedicated hardware. Further, although the program is described with reference to the flowchart of FIG. 6, other methods of implementing the electrode voltage controller 112 may alternatively be used. For example, the order of execution of the blocks may be changed, and/or some of the blocks described may be changed, eliminated, or combined. Additionally or alternatively, any or all of the blocks may be implemented by one or more hardware circuits (such as discrete and/or integrated analog and/or digital circuitry, a field programmable gate array (FPGA), an application specific integrated circuit (ASIC), a comparator, an operational-amplifier (op-amp), a logic circuit, etc.) structured to perform the corresponding operation without executing software or firmware.

As described hereinabove, the process of FIG. 6 may be implemented by coded instructions (e.g., computer and/or machine readable instructions) stored on a computer-readable medium.

FIG. 6 is an example flowchart 600 representative of example machine readable instructions that may be executed by the electrode voltage controller 112 of FIGS. 1A and 1B to apply voltage to the base electrode 110, 402 (of FIGS. 1A, 1B and/or 4) to displace the spring structure 106, 404 beyond the d/3 threshold distance (e.g., the instability point). Although the instructions of FIG. 6 are described in conjunction with the electrode voltage controller 112 FIGS. 1A, 1B and/or 5, the instructions may be used by any type of electrode voltage controller in any type of pixel structure.

At block 602, the receiver 500 receives instructions to displace the mirror 102 by X distance. As described hereinabove in conjunction with FIG. 5, the instructions may be provided by another device to control the pixel 100 according to a desired output. At block 604, the mirror displacement determiner 502 determines whether X is greater than a collapse threshold distance. The collapse threshold distance corresponds to the displacement distance that will cause the spring structure 106 to collapse (e.g., if held for more than a short duration of time). As described hereinabove, the collapse threshold distance is around d/3 where d is the distance of the spring structure 106 to the base electrode 110 when no voltage is applied by the electrode voltage controller 112.

If the mirror displacement determiner 502 determines that X is not greater than the collapse distance threshold (block 604: NO), the voltage source 504 applies a voltage to the base electrode 110 corresponding to the X distance (block 606). In this manner, the spring structure 106 is pulled toward the base electrode 110 at the desired X distance. In some examples, the voltage source 504 may transmit a preset voltage to a portion of the area of the base electrode 110 corresponding to the X distance (e.g., corresponding to a digital base electrode). In such an example, to increase the displacement, the voltage source 504 may transmit the preset voltage to a larger portion of the area of the base electrode 110. In other examples, the voltage source 504 may transmit a voltage to the entire area of the base electrode 110 corresponding to the X distance. In such an example, to increase the displacement, the voltage source 504 may transmit a higher voltage to the base electrode 110.

If the mirror displacement determiner 502 determines that X is greater than the collapse distance threshold (block 604: YES), the voltage source 504 periodically varies (e.g., using a digital pulsing signal or a sinusoid) the voltage applied to the base electrode 110 corresponding to the X distance (block 608). In some examples, the voltage source 504 may generate the period voltage where the peak of the periodic voltage corresponds to the X distance. In other examples, the voltage source 504 may generate a preset periodic voltage, where the X distance corresponds to some point along the periodic voltage.

At block 610, the transmitter 506 transmits voltage varying data and/or sampling to a receiving device (e.g., a device receiving the light reflected off the mirror 102 of FIG. 2). The voltage varying data may include the frequency, amplitude, phase, etc. corresponding to the periodic voltage and/or the periodic displacement. The sampling data may include instructions corresponding to when to sample the received signal (e.g., the mirror displacement determiner 502 determines when the receive device should sample the received signal in response to the periodic signal and the desired X distance). In this manner, the receiving device knows when to sample the received signal so that the samples correspond to the desired X distance.

At block 612, the receiver 500 determines whether additional instructions have been received corresponding to a new displacement distance. If the receiver 500 determines that new instructions have been received (block 612: YES), the process returns to block 604 according to the newly received distance. If the receiver 500 determines that new instructions have not been received (block 612: NO), the electrode voltage controller 112 continues to operate corresponding to the X distance until the receiver 500 receives a new displacement distance.

Figure 7:
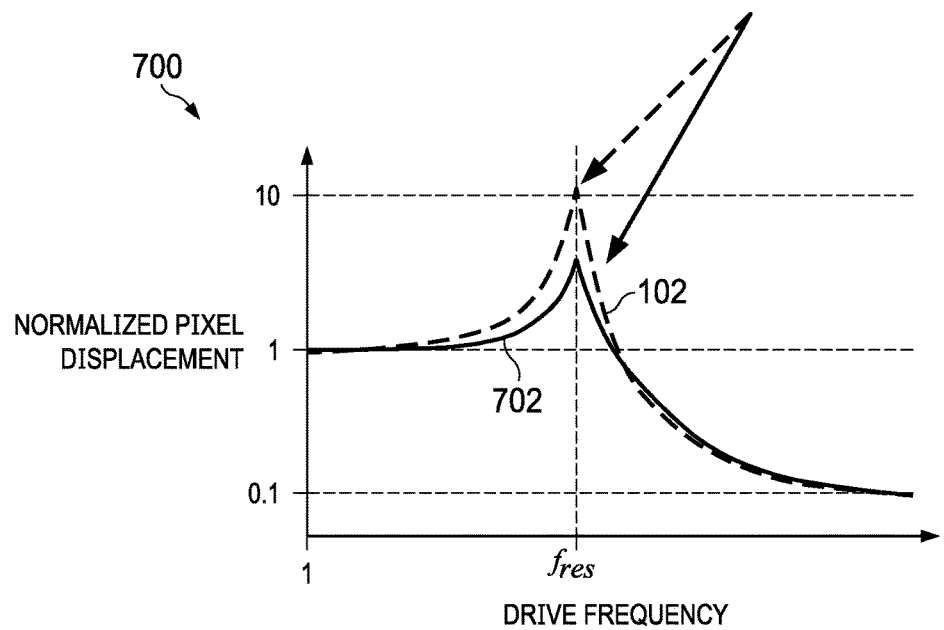
FIG. 7 is an example graph of an increased travel range generated by a harmonic resonant excitation waveform.

FIG. 7 is an example graph 700 illustrating the increased travel range generated by a harmonic resonant excitation waveform (e.g., a sinusoid or repeated pulse signal). The graph illustrates the change in normalized pixel displacement, according to frequency of the waveform for a first example mirror displacement 702 and a second example mirror displacement 704 of the mirror 102 of FIGS. 1A and 1B. The first mirror displacement 702 corresponds to a first modulation wavelength (e.g., 700 nanometers) and the example mirror displacement 704 corresponds to a second modulation wavelength (e.g., 470 nanometers). Alternatively, the first and second mirror displacements may be scaled to any fractional wavelength for any phase modulation by (a) adjusting the frequency of the drive pulses slightly off resonance and/or (B) reducing the amplitude of the bias voltage of the pulses.

As shown in the graph 700 of FIG. 7, when the device is operated in high Q regime (Q>2), such as a packaged environment with low pressure the device can be resonantly pumped. As the drive frequency approaches the resonant frequency (e.g., $$f_{res} = \sqrt{\frac{k}{m}},$$

where k corresponds to the stiffness of the spring legs 202a-c of the spring structure 106, and m corresponds to the mass of the mirror 102), the pixel displacement of the first mirror displacement 702 can reach maximum displacements of an order of magnitude greater or more than when the bias signal has a period significantly below the resonant frequency. Accordingly, the scaling of the displacement can be more than an order of magnitude higher than the nominal displacement would be for the same voltage at a frequency below the resonant frequency. In this manner, the mirror 102 can be pumped at a low voltage (e.g., at or near the resonant frequency) to cause larger oscillations. The second mirror displacement 704 illustrates a scenario in which the bias amplitude is reduced to tune the peak amplitude for a different wavelength. A similar scaling effect can be achieved by periodically biasing slightly below the resonant frequency of the device. As shown in the graph 700, the total travel of the mirror 102 is controlled while avoiding snap in (e.g., collapse). The achievable amplitude is a function of the quality factor of the pixel 100 and/or the sampling conditions. Although, each MEMS device may have different resonant frequencies proportional to its mass and/or stiffness, the graph 700 is designed with the overall system function in mind.

Figure 8:
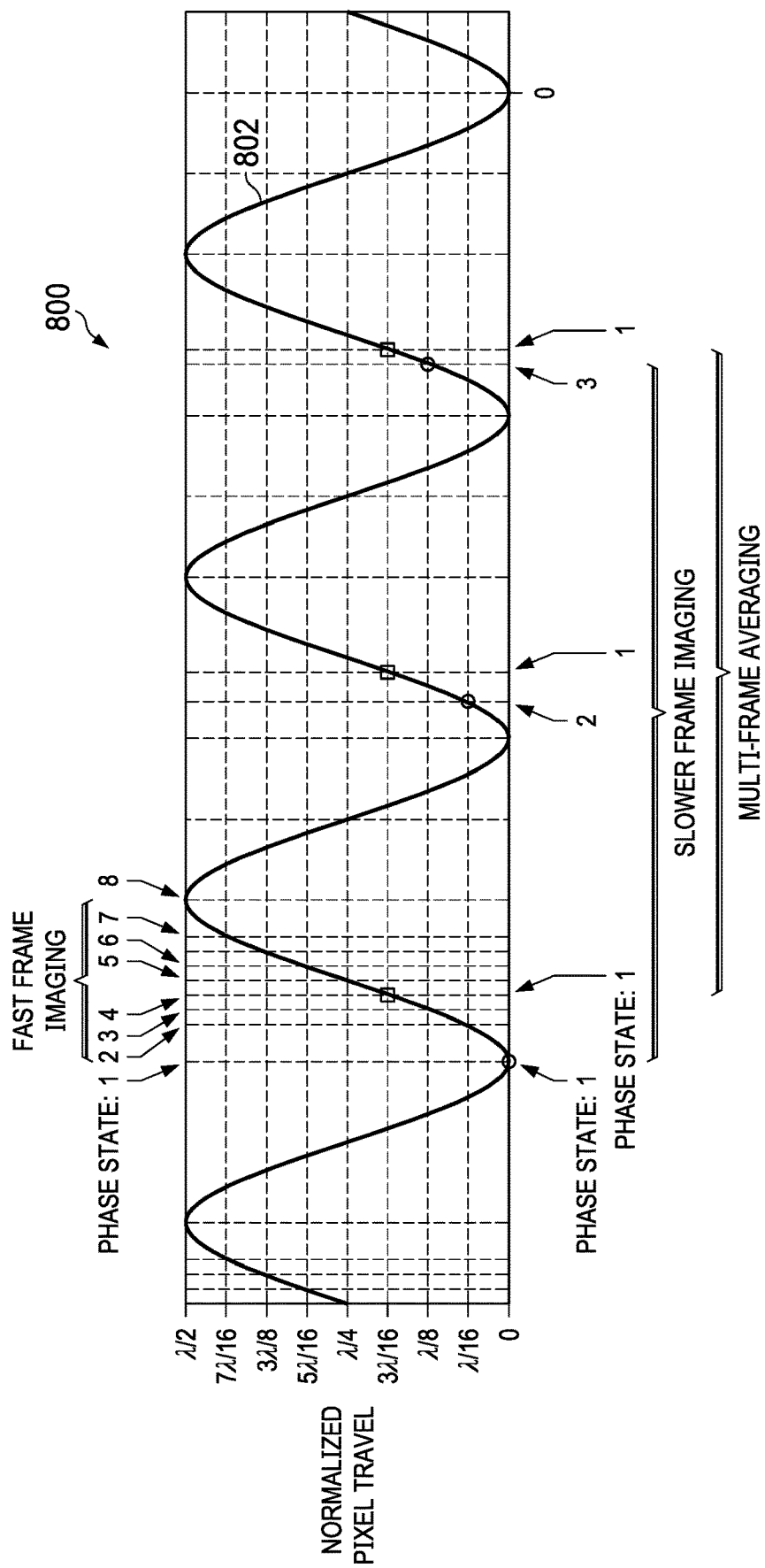
FIG. 8 is an example graph of a sampling of light reflected off an example mirror of FIGS. 1A and 1B.

FIG. 8 illustrates an example demonstration 800 corresponding to a sampling of light reflected off the mirror 102. The demonstration 800 includes an example pixel travel 802 of the mirror 102 that may be caused by a periodic symbol output by the electrode voltage controller 112 of FIGS. 1A and 1B.

The pixel travel 802 of FIG. 8 is a sinusoidal displacement representative of the variation of the mirror 102 in response to pulses and/or a sinusoid generated by the voltage controller 112 of FIGS. 1A and 1B. As shown in the demonstration 800, the pixel travels over a range from 0 to λ/2, where λ is the wavelength of the modulated light. In some examples, the total distance may be scaled to achieve a desired fractional component of the wavelength by the pulse timing, the amplitude, the drive voltage, and/or the mechanical design of the pixel. Each displacement corresponds to a differentiation of the reflected light. Accordingly, a receiving device may sample the reflected output of the mirror at different points in time to correspond to different mirror positions. For example, the fast frame imaging each represent a different state that could be used for sampling. As described hereinabove, details of the periodic pixel travel 802 may be transmitted to the receiving device, so that the receiving device can sample according to a desired mirror position. In the demonstration 800, the periods 1, 2, 3 and 4 represent different sampling points corresponding to different mirror positions. Accordingly, the mirror position may be sampled at appropriate times to achieve a desired fractional wavelength. In such a harmonic drive mode, the wavelength resolution is limited by complimentary metal oxide semiconductor (CMOS) imager timing procession. In some examples, mass or stiffness may be added/removed to the pixel design to adjust timing. All phase patterns may be captured within a single period, according to the application timing requirements, integrated circuit performance, frame upload bandwidth, and/or process uniformity. Additionally or alternatively, a frame may span multiple periods. Additionally or alternatively, averaging may be employed to compensate for pixel non-uniformity. Driving the device into resonance provides a large displacement without the need to exceed the pull-in voltage.

Figure 9A:
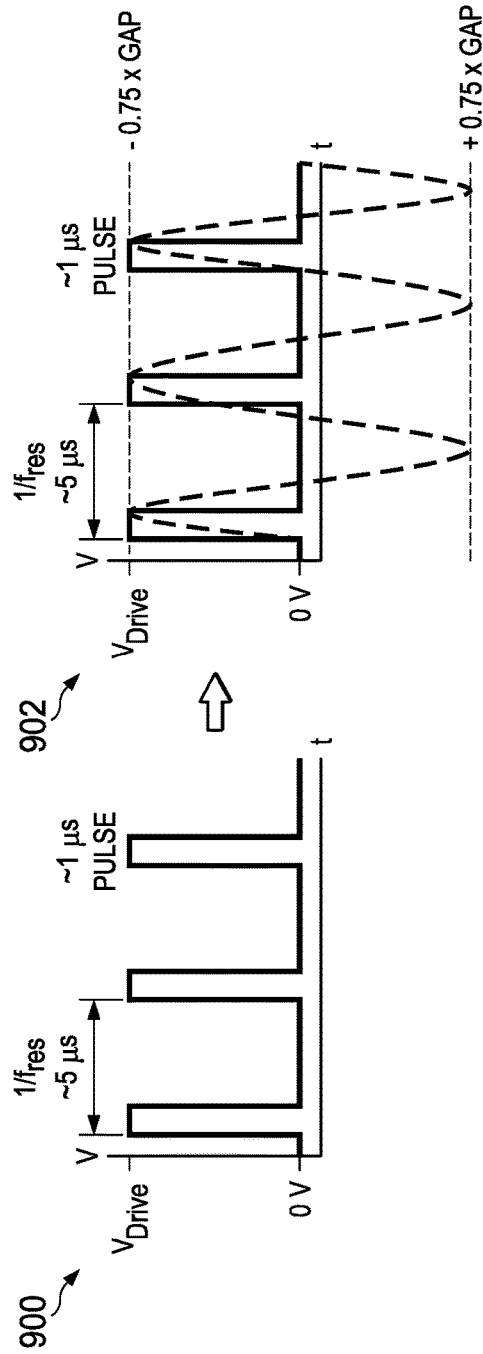
FIGS. 9A and 9B are example graphs of periodic signals that may be output by the electrode voltage controller of FIGS. 1A, 1B and 5 to cause the mirror of FIGS. 1A and 1B to periodically vary beyond an instability point without collapsing.

FIG. 9A illustrates an example periodic signal 900 that may be output by the electrode voltage controller 112 to cause the mirror 102 to periodically vary beyond the d/3 instability point without collapsing. The example of FIG. 9A includes the periodic signal 900 and an example mirror displacement 902. Although the periodic signal 900 is a series of pulses with a particular period and pulse width, the periodic signal 900 may be any type of periodic signal.

The periodic signal 900 of FIG. 9A includes equidistant pulses that repeat after 5 microseconds (e.g., 1/the resonant frequency), where the pulse has a width of roughly 1 microsecond. Alternatively, the periodic signal 900 may correspond any pattern. For example, the periodic signal 900 may be a function of the resonant frequency (e.g., $$f_{res} = \sqrt{\frac{k}{m}},$$

where both k and m will vary as a function of the specific dimensions, film thickness, and material set of the pixel design), and/or the period of the periodic signal 900 may be shorter or longer, according to the drive signal slew rate (e.g., a shorter, higher voltage pulse or a longer, lower voltage pulse). Outputting the periodic signal 900 results in the mirror displacement 902. For example, when the pulse of the periodic signal 900 is high, the mirror 102 displaces toward the base electrode 110 of FIGS. 1A and 1B, such as (−0.75)(the gap), where the gap corresponds to the distance between the base electrode 110 and the spring electrode 106 and/or the mirror 102. When the pulse ends, the mirror displacement 902 illustrates that the mirror 102 displaces away from the base electrode 110 (e.g., (0.75)(gap)). Accordingly, the mirror displacement 902 illustrates the ability of the mirror 102 to be driven beyond the d/3 instability point without a catastrophic contact (e.g., without any risk of catastrophic contact). In some examples, the drive voltage could be reduced and the width of the pulse could be widened to achieve similar results. In such examples, pumping periods can be compensated by drive waveforms to improve the transition between states through active and passive cancellation via phase shifted waveforms and/or reset pulses. When the periodic signal 900 is used in an array of pixels, pixels can be addressed solely by phase shifted version of an identical drive source, as described hereinbelow in conjunction with FIG. 10.

Figure 9B:
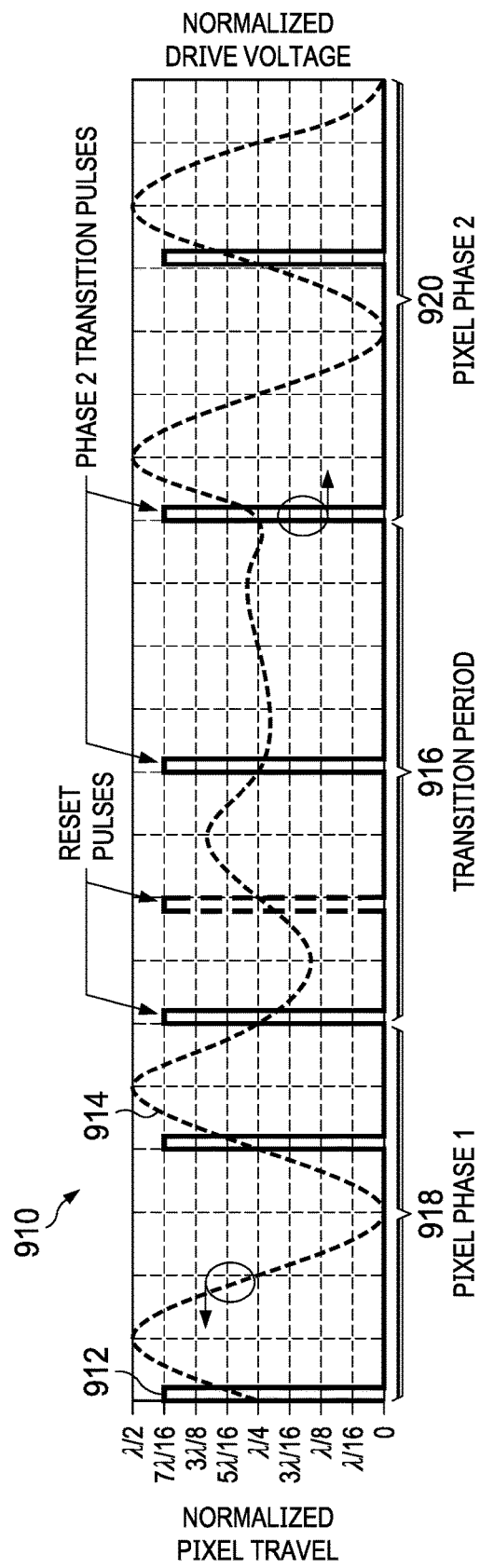

FIG. 9B illustrates an example periodic signal 910 that may be output by the electrode voltage controller 112 to cause the mirror 102 to periodically vary beyond the d/3 instability point without collapsing. The example of FIG. 9B includes the periodic signal 912 and an example mirror displacement 914. The example of FIG. 9B includes an example transition period 916 to transition between a first example pixel phase 918 and a second example pixel phase 920.

As shown in the periodic signal 910 of FIG. 9B, the electrode voltage controller 112 of FIGS. 1A and 1B may transition one or more pixels 100 from the first example phase 918 to the second example phase 920 to alter how light is reflected of the mirror 102. In some examples, such as in an underdamped environment suitable for phase pumping, the transition period 916 may be necessary to quickly adjust from the first example phase 918 to the second example phase 920. For example, the voltage controller 112 may apply one or more asynchronous pulses (e.g., reset pulses to slow the pixel travel and/or transition pulses to ready the pixel for the second example phase 920) during the transmission period 916 to speed up the transition. In some examples, the voltage controller 112 may apply a transition across the pixel 100 and/or an array of pixels depending on the drive bandwidth. In some examples, several frames may be necessary to slow the pixel 100 before properly transmitting a second phase for a second image to the pixel 100 and/or pixel array.

Figure 10:
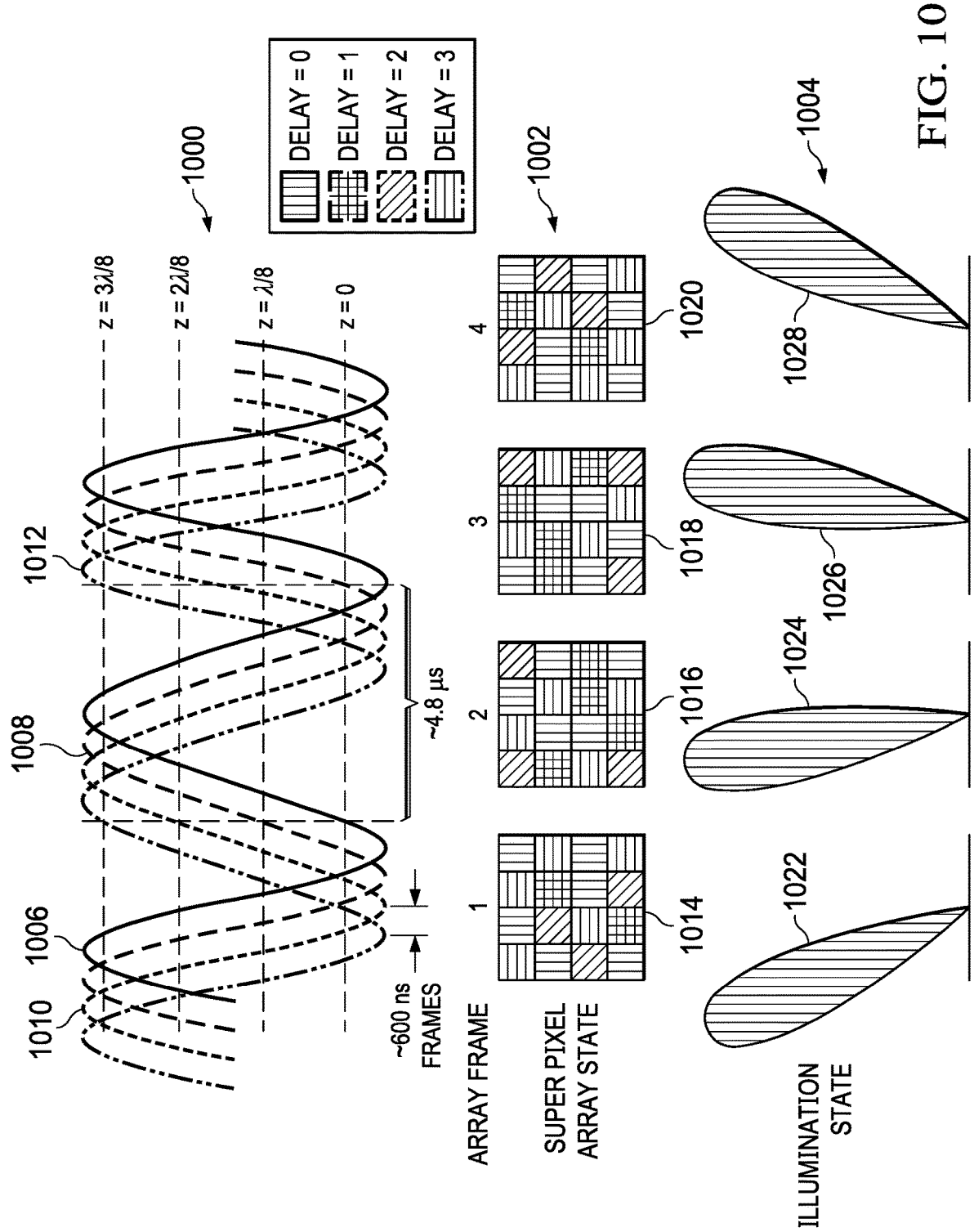
FIG. 10 illustrates example phase shifted mirror displacements to generate example pixel array frames corresponding to example illumination states.

FIG. 10 illustrates example phase shifted mirror displacements 1000 to generate example pixel array frames 1002 corresponding to example illumination states 1004. The phase shifted mirror displacements 1000 includes four example mirror displacements 1006, 1008, 1010, 1012 corresponding to four different delays. The pixel array frames 1002 includes four different frames 1012, 1016, 1018, 1020 corresponding to four different pixel array states. The illumination states 1004 include four different illumination states 1022, 1024, 1026, 1028.

The shifted mirror displacements 1000 of FIG. 10 include four example mirror displacements 1006, 1008, 1010, 1012, each corresponding to a different delay. For example, the electrode voltage controller 112 may transmit different periodic signals corresponding to the different mirror displacements 1006, 1008, 1010, 1012. In some examples, additional circuitry may be included to generate the varying amounts of delay. In this manner, the electrode voltage controller 112 may output one periodic signal and a combination of a multiplexer and delay circuitry can facilitate movement of the mirrors of different pixels in an array corresponding to the mirror displacement 1006, 1008, 1010, 1012.

The pixel array frames 1002 of FIG. 10 include four different frames 1012, 1016, 1018, 1020 that correspond to a four by four pixel array (e.g., including four mirrors at various displacement positions). For example, each of the pixels may correspond to any one of the mirror displacements 1006, 1008, 1010, 1012. Adjusting displacement of the different pixels of the pixel frames 1002 corresponds to the different example illumination states 1004. For example, the first illumination state 1022 corresponds to the light reflected of the first example frame 1014, the second illumination state 1024 corresponds to the light reflected of the second example frame 1016, the third illumination state 1026 corresponds to the light reflected of the third example frame 1018, and the fourth illumination state 1028 corresponds to the light reflected of the fourth example frame 1020. Although, the example of FIG. 2 includes four pixel array frames 1002 corresponding to four shifted mirror displacements 1000, any number and/or pattern of array frame may be used on any size pixel array. Additionally or alternatively, biasing waveforms can be scaled to achieve different displacements.

Figure 11:
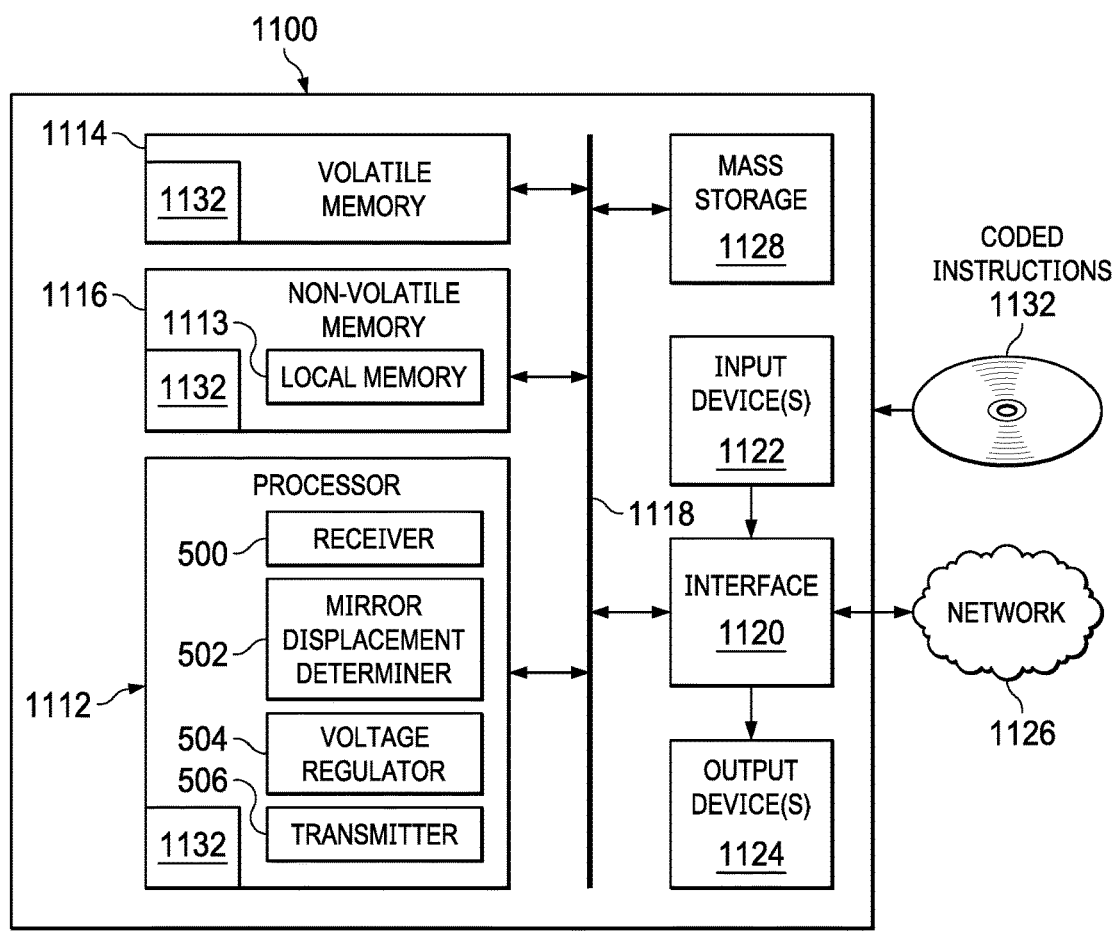
FIG. 11 is a block diagram of a processor platform to execute the machine readable instructions of FIG. 6 to control the electrode voltage controller of FIGS. 1A and 1B.

FIG. 11 is a block diagram of an example processor platform 1100 capable of executing the instructions of FIGS. 3-4 to implement the electrode voltage controller 112 of FIG. 5. For example, the processor platform 1100 can be a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1100 of the illustrated example includes a processor 1112. The processor 1112 of the illustrated example is hardware. For example, the processor 1112 can be implemented by one or more integrated circuits, logic circuits, microprocessors or controllers from any desired family or manufacturer. The hardware processor may be a semiconductor based (e.g., silicon based) device. In this example, the processor implements the receiver 500, the mirror displacement determiner 502, the voltage source 504 and the transmitter 506.

In this example, the processor 1112 includes a local memory 1113 (e.g., a cache). Also, in this example, the processor 1112 communicates with a main memory including a volatile memory 1114 and a non-volatile memory 1116 via a bus 1118. The volatile memory 1114 may be implemented by synchronous dynamic random access memory (SDRAM), dynamic random access memory (DRAM), RAMBUS dynamic random access memory (RDRAM) and/or any other type of random access memory device. The non-volatile memory 1116 may be implemented by flash memory and/or any other desired type of memory device. Access to the main memory 1114, 1116 is controlled by a memory controller.

The processor platform 1100 of the illustrated example also includes an interface circuit 1120. The interface circuit 1120 may be implemented by any type of interface standard, such as an Ethernet interface, a universal serial bus (USB), and/or a PCI express interface.

In the illustrated example, one or more input devices 1122 are connected to the interface circuit 1120. The input device(s) 1122 permit(s) a user to enter data and/or commands into the processor 1112. For example, the input device(s) can be implemented by an audio sensor, a microphone, a camera (still or video), a keyboard, a button, a mouse, a touchscreen, a track-pad, a trackball, isopoint and/or a voice recognition system.

One or more output devices 1124 are also connected to the interface circuit 1120 of the illustrated example. For example, the output devices 1124 can be implemented by display devices (e.g., a light emitting diode (LED), an organic light emitting diode (OLED), a liquid crystal display, a cathode ray tube display (CRT), a touchscreen, a tactile output device, a printer and/or speakers). Accordingly, the interface circuit 1120 of the illustrated example usually includes a graphics driver card, a graphics driver chip and/or a graphics driver processor.

The interface circuit 1120 of the illustrated example also includes a communication device such as a transmitter, a receiver, a transceiver, a modem and/or network interface card to facilitate exchange of data with external machines (e.g., computing devices of any kind) via a network 1126 (such as an Ethernet connection, a digital subscriber line (DSL), a telephone line, coaxial cable, a cellular telephone system, etc.).

The processor platform 1100 of the illustrated example also includes one or more mass storage devices 1128 for storing software and/or data. Examples of such mass storage devices 1128 include floppy disk drives, hard drive disks, compact disk drives, Blu-ray disk drives, RAID systems, and digital versatile disk (DVD) drives.

The coded instructions 1132 of FIG. 6 may be stored in the mass storage device 1128, the volatile memory 1114, the non-volatile memory 1116, and/or another computer-readable medium.

A computer program product is an article of manufacture that has: (a) a computer-readable medium; and (b) a computer-readable program that is stored on such medium. Such program is processable (e.g., executable) by an instruction execution apparatus for causing the apparatus to perform its operations described hereinabove. For example, in response to processing (e.g., executing) such program's instructions, the apparatus performs its operations described hereinabove, so that such operations are at least partially computer-implemented.

Such program (e.g., software, firmware, and/or microcode) is written in one or more programming languages, such as: an object-oriented programming language (e.g., C++); a procedural programming language (e.g., C); and/or any suitable combination thereof. In a first example, the computer-readable medium is a computer-readable storage medium. In a second example, the computer-readable medium is a computer-readable signal medium.

A computer-readable storage medium includes any system, device and/or other non-transitory tangible apparatus (e.g., electronic, magnetic, optical, electromagnetic, infrared, semiconductor, and/or any suitable combination thereof) that is suitable for storing a program, so that such program is processable by an instruction execution apparatus for causing the apparatus to perform its operations described hereinabove. Examples of a computer-readable storage medium include: an electrical connection having one or more wires; a portable computer diskette; a hard disk; a random access memory ("RAM"); a read-only memory ("ROM"); an erasable programmable read-only memory ("EPROM" or flash memory); an optical fiber; a portable compact disc read-only memory ("CD-ROM"); an optical storage device; a magnetic storage device; and/or any suitable combination thereof.

A computer-readable signal medium includes any computer-readable medium (other than a computer-readable storage medium) that is suitable for communicating (e.g., propagating or transmitting) a program, so that such program is processable by an instruction execution apparatus for causing the apparatus to perform its operations described hereinabove. In one example, a computer-readable signal medium includes a data signal having computer-readable program code embodied therein (e.g., in baseband or as part of a carrier wave), which is communicated (e.g., electronically, electromagnetically, and/or optically) via wireline, wireless, optical fiber cable, and/or any suitable combination thereof.

Accordingly, example methods, apparatus and articles of manufacture are described herein to increase efficiency and optical bandwidth of a MEMS piston-mode SLM. Examples described herein include a new spring structure for a MEMS pixel that is sized below 10 micrometers and can operate at a bias voltage of 10 V or less, while achieving significant displacements for light wave modulation beyond visible wavelengths. Also, examples described herein include a spring structure and/or a base electrode that is non-uniformly shaped (such as gray scale sloped, curved, etc.) to increase the instability point from a d/3 displacement distance (e.g., corresponding to conventional MEMS pixels) to a larger displacement distance (e.g., a 2d/3 displacement distance). Further examples described herein apply a voltage to a base electrode that is periodic (e.g., using a digital pulse or a sinusoid) to a voltage that corresponds to a distance above (e.g., away from) the d/3 threshold distance corresponding to an instability point. Because the voltage corresponds to a distance beyond the d/3 threshold distance for a short duration of time, the first electrode can travel up to a 9d/10 distance to the second electrode without collapsing, thereby achieving a pixel travel that is nearly three times as far as conventional MEMS techniques. Accordingly, examples described herein provide a sub-10 micron pixel that can modulate large light wavelengths (e.g. 1550 nm) with low drive voltage (e.g., 10 V).

Modifications are possible in the described embodiments, and other embodiments are possible, within the scope of the claims.

What is claimed is:

1. Apparatus to increase displacement of a mirror in a microelectromechanical system piston-mode spatial light modulator, the apparatus comprising:
   an electrode with spring legs;
   a base electrode;
   a receiver configured to receive an instruction to displace the electrode by a displacement distance;
   a mirror displacement determiner coupled to the receiver and configured to determine that the displacement distance is beyond an instability point of the electrode and to determine a periodic signal corresponding to the displacement distance; and
   a voltage source to output a periodic voltage to the base electrode in response to the periodic signal, the periodic voltage to cause the spring legs to vary displacement of the electrode with respect to the base electrode according to the periodic voltage, the displacement including distances beyond the instability point.

2. The apparatus of claim 1, further including a transmitter to transmit at least one of periodic voltage data or sampling data to a receiving device.

3. The apparatus of claim 1, wherein the periodic voltage is to allow the electrode to displace beyond the instability point without collapsing.

4. The apparatus of claim 1, wherein the periodic voltage is at least one of a digital pulsing signal or a sinusoid.

5. The apparatus of claim 1, wherein, when the instruction is for a displacement distance that is less than the instability point of the electrode:
the mirror displacement determiner is to determine a stable signal corresponding to the displacement distance; and
in response to the stable signal, the voltage source is to output a stable voltage to the base electrode to cause the spring legs to displace the electrode to the displacement distance.

6. The apparatus of claim 1, wherein the electrode is coupled to the mirror.

7. A method to increase displacement of a mirror in a microelectromechanical system piston-mode spatial light modulator, the method comprising:
determining a periodic signal corresponding to a displacement distance of an electrode of a pixel beyond an instability point of the electrode; and
outputting a periodic voltage to a base electrode in response to the periodic signal, the periodic voltage causing spring legs of the electrode to vary displacement of the electrode with respect to the base electrode according to the periodic voltage, the displacement including distances beyond the instability point.

8. The method of claim 7, further including transmitting at least one of periodic voltage data or sampling data to a receiving device.

9. The method of claim 7, wherein outputting the periodic voltage allows the spring legs to displace the electrode beyond the instability point without collapsing.

10. The method of claim 7, wherein the periodic voltage is at least one of a digital pulsing signal or a sinusoid.

11. The method of claim 7, further including:
when the displacement distance is less than the instability point of the electrode: determining a stable signal corresponding to the displacement distance; and, in response to the stable signal, outputting a stable voltage to the base electrode to cause the spring legs to displace the electrode to the displacement distance.

12. The method of claim 7, wherein the electrode is coupled to the mirror.

13. A non-transitory computer-readable medium storing instructions that are processable by an instruction execution apparatus for causing the apparatus to perform a method comprising:
determining a periodic signal corresponding to a displacement distance of an electrode of a pixel beyond an instability point of the electrode; and
outputting a periodic voltage to a base electrode in response to the periodic signal, the periodic voltage causing spring legs of the electrode to vary displacement of the electrode with respect to the base electrode according to the periodic voltage, the displacement including distances beyond the instability point.

14. The computer readable storage medium of claim 13, wherein the method includes transmitting at least one of periodic voltage data or sampling data to a receiving device.

15. The computer readable storage medium of claim 13, wherein outputting the periodic voltage allows the spring legs to displace the electrode beyond the instability point without collapsing.

16. The computer readable storage medium of claim 13, wherein the periodic voltage is at least one of a digital pulsing signal or a sinusoid.

17. The computer readable storage medium of claim 13, wherein the method includes:
when the displacement distance is less than the instability point of the electrode: determining a stable signal corresponding to the displacement distance; and, in response to the stable signal, outputting a stable voltage to the base electrode to cause the spring legs to displace the electrode to the displacement distance.

18. The computer readable storage medium of claim 13, wherein the electrode is coupled to a mirror.

* * * * *